United States Patent
Vampola et al.

(10) Patent No.: US 9,806,238 B2
(45) Date of Patent: Oct. 31, 2017

(54) LIGHT EMITTING DEVICE WITH WAVELENGTH CONVERTING SIDE COAT

(71) Applicant: KONINKLIJKE PHILIPS N.V., Eindhoven (NL)

(72) Inventors: Kenneth Vampola, Eindhoven (NL); Han Ho Choi, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 14/388,979

(22) PCT Filed: Mar. 26, 2013

(86) PCT No.: PCT/IB2013/052390
§ 371 (c)(1),
(2) Date: Sep. 29, 2014

(87) PCT Pub. No.: WO2013/144834
PCT Pub. Date: Oct. 3, 2013

(65) Prior Publication Data
US 2015/0060917 A1  Mar. 5, 2015

Related U.S. Application Data

(60) Provisional application No. 61/617,903, filed on Mar. 30, 2012.

(51) Int. Cl.
*H01L 33/00* (2010.01)
*H01L 33/50* (2010.01)

(52) U.S. Cl.
CPC .......... *H01L 33/504* (2013.01); *H01L 33/505* (2013.01); *H01L 2933/0041* (2013.01)

(58) Field of Classification Search
CPC ....... H01L 33/44; H01L 33/62; H01L 33/504; H01L 33/505; H01L 2933/0041
USPC .......................................................... 257/98
See application file for complete search history.

(56) References Cited

U.S. PATENT DOCUMENTS

| | | |
|---|---|---|
| 5,959,316 A | 9/1999 | Lowery |
| 6,351,069 B1 | 2/2002 | Lowery |
| 6,504,301 B1 | 1/2003 | Lowery |
| 6,586,882 B1 | 7/2003 | Harbers |
| 6,680,569 B2 | 1/2004 | Mueller-Mach |

(Continued)

FOREIGN PATENT DOCUMENTS

| | | |
|---|---|---|
| CN | 101657910 A | 2/2010 |
| CN | 101673787 A | 3/2010 |

(Continued)

OTHER PUBLICATIONS

Simpson & Weiner, The Oxford English Dictionary, 1989, Clarendon Press, vol. 20.*

(Continued)

*Primary Examiner* — Trung Q Dang
*Assistant Examiner* — Patricia Reddington

(57) ABSTRACT

Embodiments of the invention include a semiconductor light emitting device, a first wavelength converting member disposed on a top surface of the semiconductor light emitting device, and a second wavelength converting member disposed on a side surface of the semiconductor light emitting device. The first and second wavelength converting members include different wavelength converting materials.

22 Claims, 1 Drawing Sheet

(56) References Cited

U.S. PATENT DOCUMENTS

| | | |
|---|---|---|
| 6,791,116 B2 | 9/2004 | Takahashi et al. |
| 7,052,152 B2 | 5/2006 | Harbers |
| 7,250,715 B2 | 7/2007 | Mueller |
| 7,301,175 B2 | 11/2007 | Izuno et al. |
| 7,361,938 B2 | 4/2008 | Meuller |
| 7,942,540 B2 | 5/2011 | Harbers |
| 7,942,556 B2 | 5/2011 | Harbers |
| 7,984,999 B2 | 7/2011 | Harbers |
| 7,988,336 B1 | 8/2011 | Harbers |
| 8,030,665 B2 | 10/2011 | Ludwig |
| 8,104,908 B2 | 1/2012 | Harbers |
| 8,104,922 B2 | 1/2012 | Harbers et al. |
| 2003/0214233 A1 | 11/2003 | Takahashi et al. |
| 2005/0269582 A1* | 12/2005 | Mueller ............... C04B 35/44 257/94 |
| 2009/0057690 A1* | 3/2009 | Chakraborty ........ H01L 33/44 257/88 |
| 2010/0044735 A1 | 2/2010 | Oyamada |
| 2011/0175117 A1 | 7/2011 | Jagt |
| 2011/0317397 A1 | 12/2011 | Trottier et al. |
| 2012/0037882 A1 | 2/2012 | Yoo et al. |
| 2013/0200417 A1 | 8/2013 | Preuss |

FOREIGN PATENT DOCUMENTS

| | | |
|---|---|---|
| CN | 102208521 A | 10/2011 |
| DE | 102010021011 A1 | 11/2011 |
| DE | 1020110035490 A1 | 3/2012 |
| EP | 1976030 A1 | 10/2008 |
| JP | 2002261325 A | 9/2002 |
| JP | 2006005367 A | 1/2006 |
| JP | 2006156604 A | 6/2006 |
| JP | 2006352036 A | 12/2006 |
| JP | 2008300460 A | 12/2008 |
| JP | 2010519757 A | 6/2010 |
| JP | 2013182918 A | 9/2013 |
| RU | 2303833 C2 | 7/2007 |
| WO | 2007052777 A1 | 5/2007 |
| WO | 2009028861 A2 | 3/2009 |
| WO | 2011144385 A1 | 11/2011 |
| WO | WO-2012/025377 A1 | 3/2012 |

OTHER PUBLICATIONS

CN Office Action, Application 201380018279.X, Jul. 26, 2016, 19 pps.
EPO as ISA, PCT/IB2013/052390 filed Mar. 26, 2013, "International Search Report and Written Opinion", mailed Aug. 22, 2013, 10 pages.
JP Office Action, Application 2015-502519, Dec. 20, 2016, 14 pps.
RU Office Action, Application 2014143771, Feb. 6, 2017, 13 pps.
CN Office Action, Application 201380018279.X, Mar. 8, 2017, 19 pps.
JP Office Action dated Jul. 4, 2017, Japan Application No. 2015-502519, 5 pages.

\* cited by examiner

LIGHT EMITTING DEVICE WITH WAVELENGTH CONVERTING SIDE COAT

CROSS-REFERENCE TO PRIOR APPLICATIONS

This application is the U.S. National Phase application under 35 U.S.C. §371 of International Application No. PCT/IB2013/052390, filed on Mar. 26, 2013, which claims the benefit of U.S. Patent Application No. 61/617,903, filed on Mar. 30, 2012. These applications are hereby incorporated by reference herein.

FIELD OF THE INVENTION

The present invention relates to a semiconductor light emitting device such as a light emitting diode combined with a side coating including wavelength converting material such as phosphor.

BACKGROUND

Semiconductor light-emitting devices including light emitting diodes (LEDs), resonant cavity light emitting diodes (RCLEDs), vertical cavity laser diodes (VCSELs), and edge emitting lasers are among the most efficient light sources currently available. Materials systems currently of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. Typically, III-nitride light emitting devices are fabricated by epitaxially growing a stack of semiconductor layers of different compositions and dopant concentrations on a sapphire, silicon carbide, III-nitride, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices may be combined with wavelength converting materials such as phosphors, as is known in the art, to form white light or light of other colors. Wavelength converting materials absorb light emitted by the light emitting region of the III-nitride device and emit light of a different wavelength. Wavelength-converted III-nitride devices may be used for many applications such as general illumination, backlights for displays, automotive lighting, and camera flashes i.e. strobes or other flashes.

SUMMARY

It is an object of the invention to provide a semiconductor light emitting device with a wavelength converting side coat. The side coat may improve the efficiency of the device.

Embodiments of the invention include a semiconductor light emitting device, a first wavelength converting member disposed on a top surface of the semiconductor light emitting device, and a second wavelength converting member disposed on a side surface of the semiconductor light emitting device. The first and second wavelength converting members include different wavelength converting materials.

A method according to embodiments of the invention includes providing a semiconductor light emitting device. A first wavelength converting material is disposed over a top surface of the semiconductor light emitting device. After disposing a first wavelength converting material over the top surface of the semiconductor light emitting device, a second wavelength converting material is disposed on a side surface of the semiconductor light emitting device.

DETAILED DESCRIPTION

Figure 1:
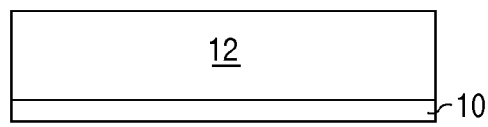
FIG. 1 illustrates a wavelength converting layer disposed on a top surface of an LED.

FIG. 1 illustrates a semiconductor device such as an LED 10 with a wavelength converting structure 12 such as a phosphor layer disposed on the top surface of the LED. Wavelength converting structure 12 may be a structure that is prefabricated, i.e. fabricated separately from LED 10, then attached to LED 10. One example of a prefabricated wavelength converting structure 12 is a ceramic phosphor, described in more detail in U.S. Pat. No. 7,361,938, which is incorporated herein by reference. A ceramic phosphor may be formed by sintering a powder phosphor into a ceramic body. The phosphor particles are heated until they begin to melt and stick together. The heated phosphor particles are then formed into a ceramic slab. The ceramic slab may be free of conventional binder materials such as organic binder materials, epoxy, silicone, inorganic binder materials, and glass. Another example of a prefabricated wavelength converting structure 12 is a phosphor or other wavelength converting material disposed in a transparent matrix, such as glass or silicone. Prefabricated wavelength converting structures are often formed as a large sheet that is then separated into structures of a size that corresponds to LED 10. As a result, as illustrated in FIG. 1, a prefabricated wavelength converting structure 12 often does not cover the sides of LED 10.

Prefabricated wavelength converting structures 12 are often thick compared to the thickness of LED 10. For example, a ceramic phosphor slab or glass member with embedded phosphor may be 200 µm thick while LED 10 may be 50 µm thick. Due to the thickness of wavelength converting structure 12, some light is emitted from the sides of wavelength converting structure 12. Side light is undesirable because it can cause variations in the appearance of light emitted from the structure illustrated in FIG. 1, depending on the viewing angle.

In embodiments of the invention, a wavelength converting material is disposed on the sides of a wavelength-converted LED. The wavelength converting side coat may reduce color-over-angle variations in the light emitted from the structure and may improve the utilization of light from the LED.

Figure 2:
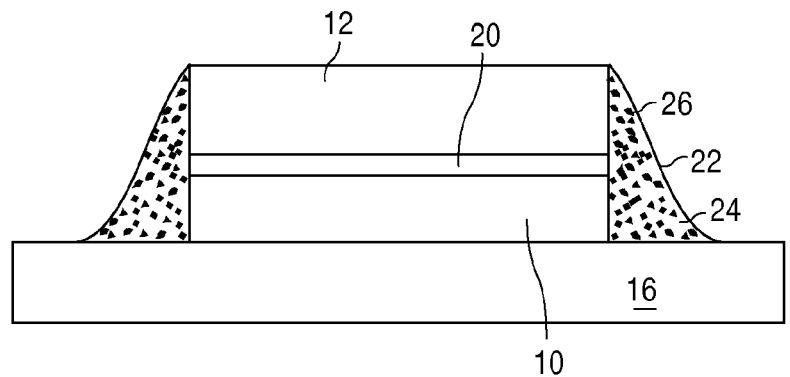
FIG. 2 illustrates a structure according to embodiments of the invention including an LED, a wavelength converting layer, and a wavelength converting side coat.

FIG. 2 illustrates a structure according to embodiments of the invention. A semiconductor light emitting device such as an LED 10 is provided. Though in the examples below the semiconductor light emitting devices are III-nitride LEDs that emit blue or UV light, semiconductor light emitting devices besides LEDs such as laser diodes and semiconductor light emitting devices made from other materials systems such as other III-V materials, III-phosphide, III-arsenide, II-VI materials, ZnO, or Si-based materials may be used.

Any suitable III-nitride LED may be used and such LEDs are well known. LED 10 may be, for example, a flip chip device configured to emit a majority of light from the top surface of the LED. To form such an LED, a III-nitride semiconductor structure is first grown on a growth substrate, as is known in the art. The growth substrate may be any suitable substrate such as, for example, sapphire, SiC, Si, GaN, or composite substrates. The semiconductor structure includes a light emitting or active region sandwiched between n- and p-type regions. An n-type region may be grown first and may include multiple layers of different compositions and dopant concentration including, for example, preparation layers such as buffer layers or nucleation layers, and/or layers designed to facilitate removal of the growth substrate, which may be n-type or not intentionally doped, and n- or even p-type device layers designed for particular optical, material, or electrical properties desirable for the light emitting region to efficiently emit light. A light emitting or active region is grown over the n-type region. Examples of suitable light emitting regions include a single thick or thin light emitting layer, or a multiple quantum well light emitting region including multiple thin or thick light emitting layers separated by barrier layers. A p-type region may then be grown over the light emitting region. Like the n-type region, the p-type region may include multiple layers of different composition, thickness, and dopant concentration, including layers that are not intentionally doped, or n-type layers. The total thickness of all the semiconductor material in the device is less than 10 µm in some embodiments and less than 6 µm in some embodiments.

A metal p-contact is formed on the p-type region. If a majority of light is directed out of the semiconductor structure through a surface opposite the p-contact, such as in a flip chip device, the p-contact may be reflective. A flip chip device may be formed by patterning the semiconductor structure by standard photolithographic operations and etching the semiconductor structure to remove a portion of the entire thickness of the p-type region and a portion of the entire thickness of the light emitting region, to form a mesa which reveals a surface of the n-type region on which a metal n-contact is formed. The mesa and p- and n-contacts may be formed in any suitable manner. Forming the mesa and p- and n-contacts is well known to a person of skill in the art.

The semiconductor structure may be connected to a support through the p- and n-contacts. The support is a structure that mechanically supports the semiconductor structure. The support is a self-supporting structure suitable to attach to a structure on which LED 10 is mounted. For example, the support may be reflow-solderable. Any suitable support may be used. Examples of suitable supports include an insulating or semi-insulating wafer with conductive vias for forming electrical connections to the semiconductor structure, such as a silicon wafer, thick metal bonding pads formed on the semiconductor structure, for example by plating, or a ceramic, metal, or any other suitable mount.

LED 10, which includes the semiconductor structure, metal contacts, and support described above, may be optionally attached to a mount 16. Mount 16 may be optically reflective and thermally conductive. Electrical contact to LED 10 may be made through mount 16. Examples of suitable mounts 16 include metal core printed circuit board, FR4-based printed circuit board, ceramic, metal, copper, plastic, and silicone. In some embodiments, the top surface of mount 16 is reflective, or is coated with a reflective substance such as a reflective paint or a layer of a reflective metal. Mount 16 may have a thermal conductivity of at least 0.1 W/mK (silicone) in some embodiments, at least 10 W/mK in some embodiments, and at least 100 W/mK in some embodiments, and between 0.1 W/mK and 400 W/mK in some embodiments.

A wavelength converting layer 12 is formed on the top surface of LED 10. Wavelength converting layer 12 may be one or more conventional phosphors, organic phosphors, quantum dots, organic semiconductors, II-VI or III-V semiconductors, II-VI or III-V semiconductor quantum dots or nanocrystals, dyes, polymers, or materials such as GaN that luminesce. Any suitable phosphor may be used, including but not limited to garnet-based phosphors, $Y_3Al_5O_{12}$:Ce, $Lu_3Al_5O_{12}$:Ce, $Y_3Al_{5-x}Ga_xO_{12}$:Ce, $(Ba_{1-x}Sr_x)SiO_3$:Eu (BOSE), nitride-based phosphors, $(Ca,Sr)AlSiN_3$:Eu, and $(Ca,Sr,Ba)_2Si_5N_8$:Eu. Wavelength converting material 12 may include a single wavelength converting material or multiple wavelength converting materials which may be mixed together or disposed on the top of LED 10 in separate layers. Wavelength converting layer often does not cover the sides of LED 10, though in some embodiments wavelength converting layer 12 may extend over the sides of LED 10 and a second wavelength converting layer 22, described below, may be formed over the portion of wavelength converting layer 12 that covers the sides of LED 10.

In some embodiments, wavelength converting layer 12 is formed at the same time it is attached to LED 10. Examples of such wavelength converting layers include powder phosphors formed by electrophoretic deposition, and dyes or powder phosphors mixed with transparent binder material such as silicone or epoxy that are molded, screen printed, spray coated, or injected over LED 10.

In some embodiments, wavelength converting layer 12 is a prefabricated wavelength converting layer such as a ceramic phosphor or a wavelength converting material disposed in glass or another transparent, solid material. Suitable prefabricated wavelength converting materials are described above in the text accompanying FIG. 1. Prefabricated wavelength converting layers 12 may be attached to the top surface of LED 10 by a transparent bonding layer 20 which may be any suitable bonding material such as epoxy, silicone, or glass. Alternatively, prefabricated wavelength converting layer 12 may be attached to LED 10 without a bonding layer, for example by sintering or hot-pressing.

Figure 3:
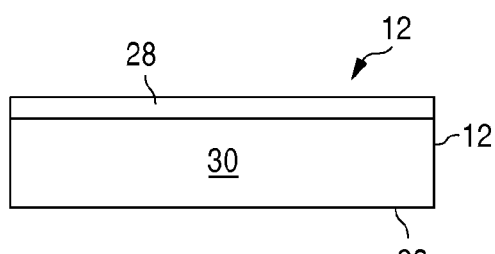
FIGS. 3, 4, and 5 illustrate prefabricated wavelength converting structures.
Figure 4:
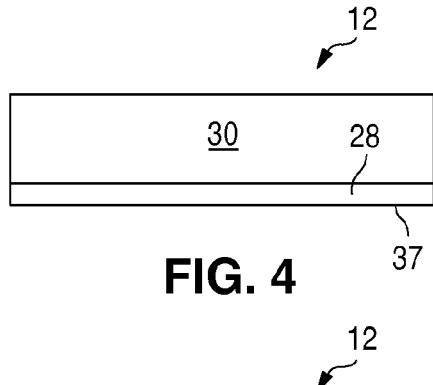
Figure 5:
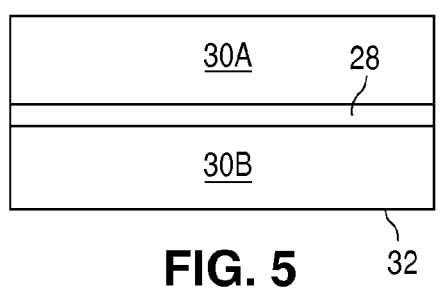

FIGS. 3, 4, and 5 illustrate examples of different prefabricated wavelength converting members 12. In the wavelength converted member 12 illustrated in FIG. 3, the wavelength converting material 28 is confined to a portion of the wavelength converting member furthest from LED 10. (LED 10 is disposed proximate the bottom surface 32 of wavelength converting member 12.) The remainder 30 of wavelength converting member 12 may be a transparent material, or a scattering structure. For example, wavelength converting material 28 may be phosphor disposed in a transparent material such as glass. Transparent portion 30 may be glass without wavelength converting material, with or without scattering particles embedded in the glass. The wavelength converting member 12 may be a ceramic phosphor. A phosphor typically includes a crystalline matrix and an activating dopant. For example, a YAG crystal may be doped with the activating dopant cerium and/or europium, as is known in the art. The activating dopant causes the crystalline matrix to emit light. In a ceramic phosphor formed according to the structure illustrated in FIG. 3, portion 28 may include the crystalline matrix and the activating dopant. Portion 30 may include just the crystalline matrix without activating dopant. Portions 28 and 30 may be sintered together into a ceramic slab, as described above.

In the wavelength converting member 12 illustrated in FIG. 4, the wavelength converting portion 28 is confined to the portion of wavelength converting member 12 closest to the LED (bottom surface 32). The transparent portion 30 is located above wavelength converting portion 28.

In the wavelength converting member 12 illustrated in FIG. 5, the wavelength converting portion 28 is disposed in the center of wavelength converting member 12. Transparent portions 30A and 30B are disposed above and below wavelength converting portion 28.

Returning to FIG. 2, a side coating 22 is formed on the sides of LED 10 and wavelength converting layer 12. The side coating 22 may include a wavelength converting material 26 disposed in a transparent matrix 24. The wavelength converting material 26 may be one or more conventional phosphors, organic phosphors, quantum dots, organic semiconductors, II-VI or III-V semiconductors, II-VI or III-V semiconductor quantum dots or nanocrystals, dyes, polymers, or materials such as GaN that luminesce. Any suitable phosphor may be used, including but not limited to garnet-based phosphors, $Y_3Al_5O_{12}$:Ce, $Lu_3Al_5O_{12}$:Ce, $Y_3Al_{5-x}Ga_xO_{12}$:Ce, $(Ba_{1-x}Sr_x)SiO_3$:Eu (BOSE), nitride-based phosphors, (Ca,Sr)AlSiN$_3$:Eu, and (Ca,Sr,Ba)$_2$Si$_5$N$_8$:Eu. Wavelength converting material 26 may include a single wavelength converting material or multiple wavelength converting materials which may be mixed together or disposed on the side of the structure in separate layers.

In some embodiments, side coating 22 is configured to scatter light incident on it. In some embodiments, a scattering wavelength converting material such as a powder phosphor is used. In some embodiments, scattering particles such as $TiO_2$ or any other suitable scattering material are mixed with a scattering or non-scattering wavelength converting material in side coating 22. Alternatively, scattering particles may be formed over or under wavelength converting side coating 22 as a separate side coating layer.

Transparent matrix 24 may be any suitable transparent material such as silicone or epoxy. In some embodiments, transparent matrix 24 is omitted and wavelength converting material 26 is applied directly to the sides of LED 10 and wavelength converting member 12.

Side coating 22 may be formed by any suitable technique. In some embodiments, side coating 22 is formed by mixing a wavelength converting material such as a powder phosphor with a liquid matrix material, such as silicone, to form a slurry. The slurry may be formed into a sheet then partially cured such that the sheet is flexible. The flexible sheet is then laminated on the sides of LED 10 using a commercially available laminating machine. Alternatively, the slurry may be dispensed on the sides of LED 10 for example using a syringe, then cured to a solid at elevated temperature, for example at 150° C. Alternatively, the slurry may be coated on the sides of LED 10 using a doctor blade, then cured to a solid at elevated temperature, for example at 150° C. In some embodiments, side coating 22 is molded on LED 10. A mold of appropriate size and shape is positioned over LED 10, then filled with a wavelength converting material mixed with a liquid matrix material. The liquid matrix material is cured into a solid, then the mold is removed, leaving side coating 22. In some embodiments, wavelength converting material is disposed over the top and sides of LED 10, then the wavelength converting material is removed from the top of LED 10, for example by scraping, leaving only a side coating 22.

In some embodiments, the side coating 22 is formed to be thick enough that all or most light incident on the side coating is wavelength converted. In some embodiments, the thickness of side coating 22 is selected to allow some unconverted light from LED 10 to escape.

In some embodiments side coating 22 is configured to create a uniform color distribution irrespective of view angle.

As described above, each of wavelength converting regions 12 and 22 may include single wavelength converting materials or multiple wavelength converting materials that are mixed or separated. In some embodiments, wavelength converting regions 12 and 22 include different wavelength converting materials. In some embodiments, a red-emitting phosphor is disposed on the sides of LED 10 and a green- or yellow-emitting phosphor is disposed on the top of LED 10. In some embodiments, a mixture of red-emitting and green/yellow-emitting phosphor is disposed on both the top and sides of LED 10. In some embodiments, a mixture of a red-emitting phosphor and red-emitting quantum dots is disposed on the sides of LED 10 and a mixture of multiple types of green-emitting phosphors is disposed on the top of LED 10. In some embodiments, a single red-emitting phosphor is disposed on the sides of LED 10 and a mixture of the same or a different red-emitting phosphor and a green/yellow-emitting phosphor is disposed on the top of LED 10. The above described embodiments are just a few of many possible combinations which may be contemplated by a person of skill in the art and which are within the scope of the invention.

In some embodiments, the device includes wavelength converting material A which can be excited by light emitted by another wavelength converting material B. Wavelength converting material A may be disposed on the sides of LED 10, while wavelength converting material B may be disposed on the top of LED 10, to minimize interaction between the wavelength converting materials.

For example, devices that make white light often include a blue LED and red- and green- or yellow-emitting phosphors. Many phosphors that emit red light will absorb light emitted by the green- or yellow-emitting phosphor. In some embodiments, a red-emitting phosphor is disposed on the sides of LED 10 and a green- or yellow-emitting phosphor is disposed on the top of LED 10. In such an arrangement, the red-emitting phosphor may absorb less green or yellow light than in a system where the red- and green/yellow-phosphors are mixed, which may improve the color rendering index of the mixed light, may improve the efficiency of the device, and may simplify color targeting.

Figure 6:
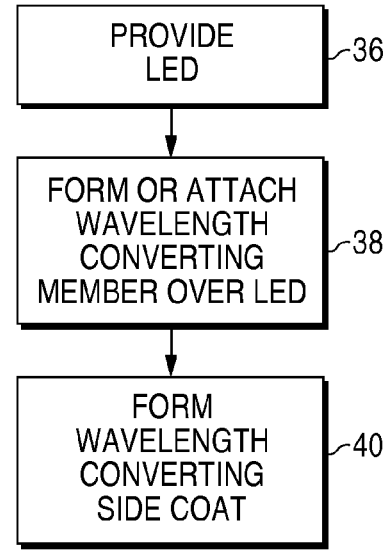
FIG. 6 illustrates a method according to embodiments of the invention.

FIG. 6 illustrates a method of forming the structure illustrated in FIG. 2. In stage 36, an LED 10 is provided. LED 10 may be attached to a mount 16, though it need not be. In stage 38, a wavelength converting member 12 is attached to LED 10 in the case of a prefabricated wavelength converting member, or formed over LED 10. In stage 40, a wavelength converting side coat 22 is formed on LED 10. Wavelength converting side coat 22 often covers the sides of both LED 10 and wavelength converting member 12, though in some embodiments wavelength converting side coat 22 may cover the sides of only LED 10 or only wavelength converting member 12, or a portion of the sides of one or both of LED 10 and wavelength converting member 12.

Embodiments of the invention may offer several advantages. The optical efficiency of a wavelength converted LED is reduced when scattering from the wavelength converting layer on the top of the LED is increased. In some embodiments, some of the scattering wavelength converting material is removed from the top of the LED and placed on the side, which may improve the efficiency of the structure. Applying wavelength converting material to the sides of LED may provide another parameter that may be adjusted to achieve a desired color point of light emitted by the structure, which may simplify color targeting or improve the efficiency of the structure. The use of a wavelength converting side coat may reduce or eliminate the need to use scattering particles in the structure, which may reduce cost and/or complexity of the structure. The use of a wavelength converting side coat may reduce color-over-angle variation in light emitted by the structure. The use of a wavelength converting side coat may permit wavelength converting materials to be separated which may improve efficiency by reducing interaction between wavelength converting regions.

Having described the invention in detail, those skilled in the art will appreciate that, given the present disclosure, modifications may be made to the invention without departing from the spirit of the inventive concept described herein. Therefore, it is not intended that the scope of the invention be limited to the specific embodiments illustrated and described.

The invention claimed is:

1. A structure comprising:
    a semiconductor light emitting device;
    a first wavelength converting member disposed on a top light-emitting surface of the semiconductor light emitting device, the first wavelength converting member comprising a first wavelength converting material and is no wider than the top light-emitting surface; and
    a second wavelength converting member disposed on a side surface of the semiconductor light emitting device, the second wavelength converting member comprising a second wavelength converting material that is not over the top light-emitting surface, the first and second wavelength converting materials being different wavelength converting materials.

2. The structure of claim 1 wherein the first wavelength converting member comprises a prefabricated wavelength converting member.

3. The structure of claim 2 wherein the first wavelength converting member comprises a phosphor embedded in a transparent material.

4. The structure of claim 1 wherein the first wavelength converting member comprises a ceramic phosphor.

5. The structure of claim 1 wherein the second wavelength converting material comprises a powder phosphor disposed in a transparent matrix.

6. The structure of claim 1 wherein:
    the first wavelength converting material emits green or yellow light; and
    the second wavelength converting material emits red light.

7. The structure of claim 1, wherein the second wavelength converting member further comprises scattering particles.

8. A method comprising:
    disposing a first wavelength converting material over a top light-emitting surface of a semiconductor light emitting device, the first wavelength converting material being confined to an area no wider than the top light-emitting surface; and
    after disposing the first wavelength converting material over the top light-emitting surface of the semiconductor light emitting device, disposing a second wavelength converting material on a side surface of the semiconductor light emitting device, the second wavelength converting material not extending over the top light-emitting surface.

9. The method of claim 8 wherein disposing the first wavelength converting material comprises attaching a prefabricated wavelength converting member to the top light-emitting surface of the semiconductor light emitting device.

10. The method of claim 9 wherein the first wavelength converting material is a ceramic phosphor.

11. The method of claim 9 wherein the first wavelength converting material is a phosphor embedded in glass.

12. The method of claim 9 wherein the prefabricated wavelength converting member comprises a first region of wavelength converting material and a second region of transparent material.

13. The method of claim 12 wherein attaching the prefabricated wavelength converting member comprises attaching the prefabricated wavelength converting member such that the first region is disposed between the semiconductor light emitting device and the second region.

14. The method of claim 12 wherein attaching the prefabricated wavelength converting member comprises attaching the prefabricated wavelength converting member such that the second region is disposed between the semiconductor light emitting device and the first region.

15. The method of claim 8 wherein disposing the second wavelength converting material on the side surface of the semiconductor light emitting device comprises molding the second wavelength converting material.

16. The method of claim 8 wherein the first and second wavelength converting materials emit light of different colors.

17. The method of claim 8 wherein disposing of the second wavelength converting material on the side surface of the semiconductor light emitting device further disposes the second wavelength converting material on a side surface of the first wavelength converting material.

18. The method of claim 9 wherein disposing the second wavelength converting material comprises molding the second wavelength converting material on the side surface of the semiconductor light emitting device and on a side surface of the prefabricated wavelength converting member.

19. The structure of claim 1 wherein the second wavelength converting member extends onto a side surface of the first wavelength converting member.

20. The structure of claim 1 wherein the second wavelength converting material can be excited by light emitted by the first wavelength converting material.

21. The structure of claim 1 wherein the semiconductor light emitting device further comprises electrical connections on a bottom surface of the semiconductor light emitting device.

22. The method of claim 8 further comprising electrically connecting a mount to electrical connections that are on a bottom surface of the semiconductor light emitting device.

* * * * *